(12) United States Patent
Hwang

(10) Patent No.: US 8,592,843 B2
(45) Date of Patent: Nov. 26, 2013

(54) LIGHT EMITTING DEVICE, LIGHT EMITTING DEVICE PACKAGE AND LIGHTING SYSTEM

(75) Inventor: Sung Min Hwang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 146 days.

(21) Appl. No.: 12/909,312

(22) Filed: Oct. 21, 2010

(65) Prior Publication Data

US 2011/0108869 A1   May 12, 2011

(30) Foreign Application Priority Data

Nov. 6, 2009  (KR) .................. 10-2009-0106704

(51) Int. Cl.
*H01L 33/00* (2010.01)

(52) U.S. Cl.
USPC  257/98; 257/79; 257/E33.065; 257/E33.072; 438/29; 438/39; 438/42

(58) Field of Classification Search
USPC ......... 257/79, 98, E33.065, E33.072; 438/29, 438/39–44
See application file for complete search history.

(56) References Cited

U.S. PATENT DOCUMENTS

| 2002/0117681 A1* | 8/2002 | Weeks et al. .................. 257/106 |
| 2006/0145164 A1* | 7/2006 | Illek et al. ........................ 257/79 |
| 2007/0284606 A1 | 12/2007 | Sugimori |

FOREIGN PATENT DOCUMENTS

| DE | 36 35 686 A1 | 4/1988 |
| DE | 10 2007 019776 A1 | 10/2008 |
| EP | 2 237 332 A2 | 6/2010 |
| JP | 2008-199004 A | 8/2008 |
| KR | 10-2007-0093556 A | 9/2007 |
| KR | 10-2009-0002285 A | 1/2009 |
| KR | 10-2009-0103955 A | 10/2009 |

OTHER PUBLICATIONS

Chuang et al.: "Improved ESD properties by combining GaN-based light-emitting diode with MOS capacitor", Solid State Electronics, Elsevier Science Publishers, Barking, GB, vol. 52, No. 7, Jul. 1, 2008, pp. 1043-1046, XP022714845.

* cited by examiner

*Primary Examiner* — Julio J Maldonado
*Assistant Examiner* — Daniel Shook
(74) *Attorney, Agent, or Firm* — McKenna Long & Aldridge LLP

(57) ABSTRACT

Embodiments relate to a light emitting device, a light emitting device package, and a lighting system. The light emitting device comprises: a light emitting structure including a first conductive type semiconductor layer, an active layer over the first conductive type semiconductor layer, and a second conductive type semiconductor layer over the active layer; a dielectric layer formed in each of a plurality of cavities defined by removing a portion of the light emitting structure; and a second electrode layer over the dielectric layer.

16 Claims, 10 Drawing Sheets

LIGHT EMITTING DEVICE, LIGHT EMITTING DEVICE PACKAGE AND LIGHTING SYSTEM

The present application claims priority under 35 U.S.C. §119 to Korean Patent Application No. 10-2009-0106704 filed on Nov. 6, 2009, which is hereby incorporated by reference in its entirety as if fully set forth herein.

BACKGROUND

Embodiments relate to a light emitting device, a light emitting device package, and a lighting system.

A light emitting device (LED) may be implemented by a p-n junction diode, which has the characteristic converting an electrical energy to a light energy, and may be formed by combining a Group III element and a Group V element of the periodic table. The LED may implement various colors by adjusting the composition ratio of a compound semiconductor.

Meanwhile, according to a related art, during an electrostatic discharge (ESD), current flows in a reverse direction, so that an active layer that is a light emitting region may be damaged.

To solve the damage problem of the LED due to the ESD, a Zener diode is connected in parallel to the LED in a reverse direction to the LED and is then mounted in a package type. Therefore, in a forward bias, current flows to the LED, so that light is emitted from the LED. In an electrostatic discharge, current flows to the Zener diode, thereby capable of preventing the LED from being damaged.

However, in a related art, since the Zener diode is mounted in a package, absorption amount of light may be decreased.

Also, in a related art vertical type LED, an n-type electrode and a p-type electrode are formed at an upper portion and a lower portion of the vertical type LED, respectively for current injection.

At this time, electrons and holes respectively injected by the n-type electrode and the p-type electrode flow into an active layer and are recombined to thus generate light. The generated light is emitted to an outside, or is absorbed into or reflected by the n-type electrode, and thus is lost inside the LED. That is, according to the related art, light emitted from a layer below the n-type electrode is absorbed into or reflected by the n-type electrode, and thus light emitting efficiency may decrease. Also, according to the related art, reabsorption of light reflected by the n-type electrode may cause generation of heat.

Further, according to the related art, the lifetime and reliability of the LED may be lowered due to current crowding.

BRIEF SUMMARY

Embodiments provide a light emitting device, a light emitting device package, and a lighting system that can prevent damage due to an electrostatic discharge.

Embodiments also provide a light emitting device, a light emitting device package, and a lighting system that can enhance light extraction efficiency as well as current spreading efficiency.

In one embodiment, a light emitting device comprises: a light emitting structure including a first conductive type semiconductor layer, an active layer over the first conductive type semiconductor layer, and a second conductive type semiconductor layer over the active layer; a dielectric layer formed in each of a plurality of cavities defined by removing a portion of the light emitting structure; and a second electrode layer over the dielectric layer.

In another embodiment, a light emitting device comprises: a light emitting structure including a first conductive type semiconductor layer, an active layer over the first conductive type semiconductor layer, and a second conductive type semiconductor layer over the active layer; capacitors respectively formed in parallel in a plurality of cavities defined by removing a portion of the light emitting structure; and a first electrode layer over the light emitting structure.

In a further embodiment, a light emitting device package comprises: a package body; a third electrode layer and a fourth electrode layer equipped in the package body; and the above light emitting device electrically connected to the third electrode layer and the fourth electrode layer.

In still another embodiment, a lighting system comprises a light emitting module including a substrate, and a light emitting device package mounted over the substrate, wherein the light emitting device package comprises: a package body; a third electrode layer and a fourth electrode layer equipped in the package body; and the above light emitting device electrically connected to the third electrode layer and the fourth electrode layer.

DETAILED DESCRIPTION OF THE EMBODIMENTS

Hereinafter, a light emitting device, a light emitting device package, and a lighting system according to the embodiments of the present disclosure will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under the other layer, and one or more intervening layers may also be present. In addition, it will also be understood that when a layer is referred to as being 'between' two layers, it can be the only layer between the two layers, or one or more intervening layers may also be present.

Figure 1:
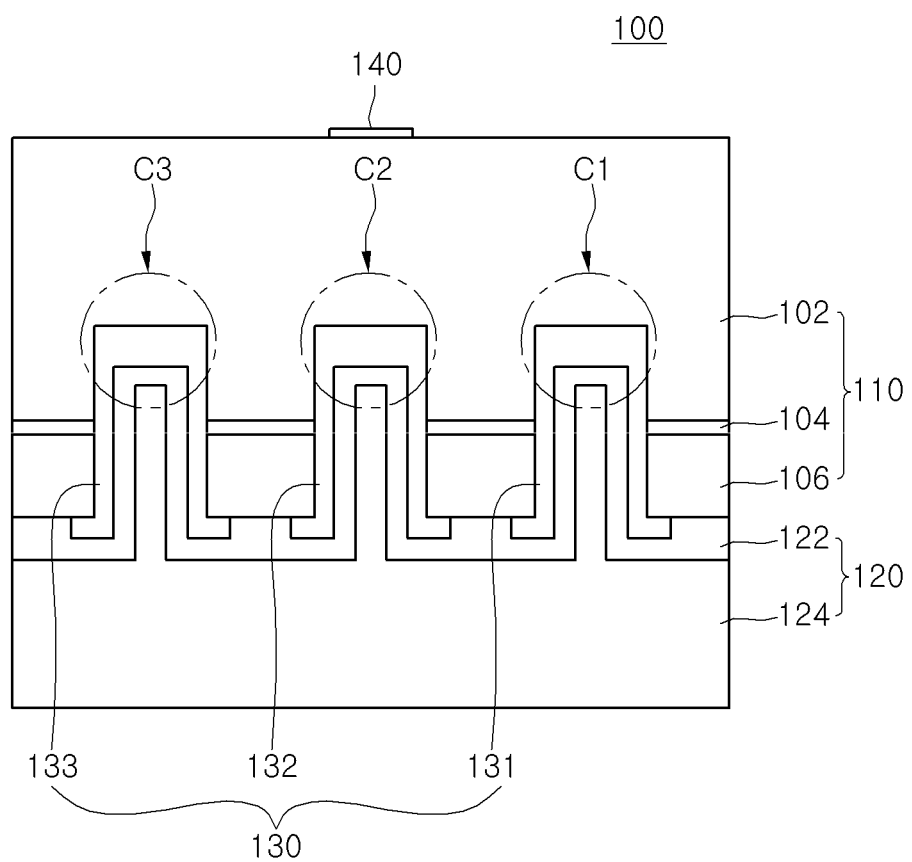
FIG. 1 is a cross-sectional view of a light emitting device according to an embodiment.
Figure 2:
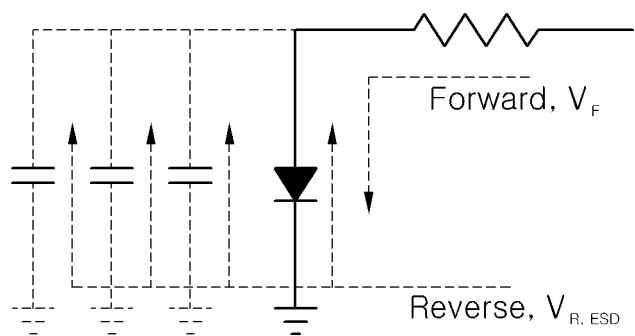
FIG. 2 is a circuit diagram of a light emitting device according to an embodiment.

FIG. 1 is a cross-sectional view of a light emitting device 100 according to an embodiment, and FIG. 2 is a circuit diagram of a light emitting device according to an embodiment.

The light emitting device (LED) 100 according to an embodiment may include a light emitting structure 110 including a first conductive type semiconductor layer 102, an active layer 104 and a second conductive type semiconductor layer 106, a dielectric layer 130 formed in each of a plurality of cavities defined by removing some of the light emitting structure 110, and a second electrode layer 120 over the dielectric layer 130.

In this embodiment, the first conductive type semiconductor layer 102, the dielectric layer 130, and the second electrode layer 120 may function as capacitors C1, C2 and C3, respectively.

By the LED, the LED package and the manufacturing method thereof according to the embodiments, electrostatic discharge damage of the LED can be prevented without any loss of light absorption.

According to the embodiment, in the case of a forward bias, current flows into the active layer and thus recombination of carriers occurs to emit light, but in an impact of a pulse type ESD, since radio frequency (RF) energy passes through a path of a dielectric layer of a capacitor, the active layer can be protected.

That is, the dielectric layer is formed on a local region in an LED chip, and an electrode is formed on the dielectric layer to thus connect a light emitting diode and multiple MOS capacitors in parallel. Through the above constitution, in a forward DC bias, current flows into a light emitting layer that is the active region, to generate light, but in a discharging, since RF energy generated by a pulse type ESD impact flows into dielectric layers of the capacitors layer, the light emitting layer can be protected.

Also, since the capacitors are formed in the LED chip to prevent ESD damage, packaging cost and process can be simplified and decrease in the absorption amount of light can be minimized.

Also, since current flow may be efficiently controlled, light extraction efficiency can be increased.

Further, current spreading can enhance the reliability of the LED.

FIG. 2 is a circuit diagram of an LED according to an embodiment.

In this embodiment, the first conductive type semiconductor layer 102, the dielectric layer 130 and the second electrode layer 120 may function as a MOS (Metal/Oxide/Semiconductor) capacitor (C). For example, the first conductive semiconductor layer 102, the first dielectric layer 131 and the second electrode layer 120 may function as a first capacitor (C1), the first conductive semiconductor layer 102, the second dielectric layer 132 and the second electrode layer 120 may function as a second capacitor (C2), and the first conductive semiconductor layer 102, the third dielectric layer 133 and the second electrode layer 120 may function as a third capacitor (C3).

While the current embodiment shows an example of three capacitors, the present disclosure is not limited thereto, but may have two or more capacitors.

The LED of FIG. 1 may be expressed by the circuit diagram of FIG. 2. Referring to FIG. 2, when a constant voltage is applied in the forward direction of the LED, current flows through the LED and thus light is emitted from the LED, whereas when an electrostatic discharge occurs in the reverse direction of the LED, some current flows through the MOS capacitor (C).

At this time, in the case where the electrostatic discharge occurs in the reverse direction of the LED, the larger the total capacitance $C_{Tot}$ is, the smaller the current flowing through the active layer due to ESD stress is, thereby capable of buffering an impact, which may be expressed by below equations.

$Q_{Dis} = C_{ESD} V_{ESD}$ ($Q_{Dis}$: charge in the discharging, $C_{ESD}$: capacitance in discharging).

$C''_{Tot} = C_{Diode} + C_{MOS}$ (with MOS).

$C_{Tot} = C_{Diode}$ (without MOS).

$I = dQ/dt = \Delta Q/t_\tau = Q_{Dis}/(RC_{Tot}) \therefore C_{Tot} \uparrow \rightarrow I \downarrow$.

$\therefore I' = Q_{Dis}/(RC_{Tot}') < I = Q_{Dis}/(RC_{Tot})$.

That is, when the voltage according to the electrostatic discharge is a reverse bias voltage, the larger the total capacitance $C_{Tot}$ is, the smaller the current flowing through the active layer due to ESD stress is, thereby capable of buffering an impact.

Figure 3:
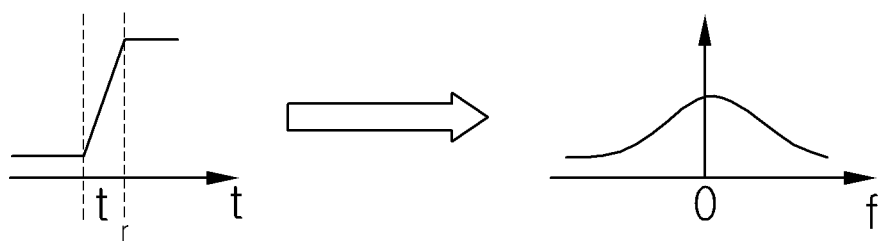
FIG. 3 is a waveform diagram when an electrostatic discharge occurs in a light emitting device according to an embodiment.

FIG. 3 is a waveform diagram when an electrostatic discharge occurs in a light emitting device according to an embodiment.

As shown in FIG. 3, a pulse waveform is subject to Fourier transformation and thus has an RF component. The sharper the rising time $t_\tau$ is, the greater the RF component.

As expressed by below equation, the higher the frequency is, the lower the impedance is due to capacitance. Therefore, in the case where the application voltage is a reverse bias voltage according to an electrostatic discharge, as the impedance of the MOS capacitor decreases, RF current may flow through the MOS capacitor.

$Z = Z_R + jZ_{Im}$ ($Z_R$: Real Impedance, J: imaginary number, $Z_{Im}$: Impedance due to capacitor). Impedance $Z_{Im,C} = 1/(j\omega C)$ (where $\omega = 2\pi f$). Capacitor That is, in the case where the application voltage is a reverse bias voltage according to the electrostatic discharge, as the impedance of the MOS capacitor decreases, RF current may flow through the MOS capacitor.

Meanwhile, according to the embodiment, since the cavity region A positioned vertically below the first electrode 140 does not have the active layer 104, generation of light due to recombination of carriers does not occur.

Also, an etching of the light emitting structure may be performed from the second conductive type semiconductor layer 106 to some of the active layer 104 or the first conductive type semiconductor layer 102. Therefore, since the dielectric layer 130 is later formed in the cavity, current is not smoothly supplied to the cavity-forming region, and thus light is not generated from the active layer 104 over the cavity, thereby capable of minimizing absorption of light by the first electrode 140 existing over the cavity.

By the LED, the LED package and the manufacturing method thereof according to the embodiments, electrostatic discharge damage of the LED can be prevented without any loss of light absorption.

That is, the dielectric layer is formed on a local region in an LED chip, and an electrode is formed on the dielectric layer to thus connect a light emitting diode and capacitors in parallel. Through the above constitution, in a forward DC bias, current flows into a light emitting layer that is the active region, to generate light, but in a discharging, since RF energy generated by a pulse type ESD impact flows into dielectric layers of the capacitors layer, the light emitting layer can be protected.

Also, since the capacitors are formed in the LED chip to prevent ESD damage, packaging cost and process can be simplified and decrease in the absorption amount of light can be minimized.

Also, since current flow may be efficiently controlled, light extraction efficiency can be increased. Further, according to the embodiment, current spreading can enhance the reliability of the LED.

Hereinafter, a method for manufacturing an LED according to an embodiment will be described with reference to FIGS. 4 through 7.

In this embodiment, an LED may be formed of a material such as GaN, GaAs, GaAsP, GaP, or the like. For example, a Green~Blue LED may be formed of GaN (InGaN), and a Yellow~Red LED may be formed of InGaAlP or AlGaAs. By changing the composition of the material, it is also possible to implement a full color LED.

Figure 4:
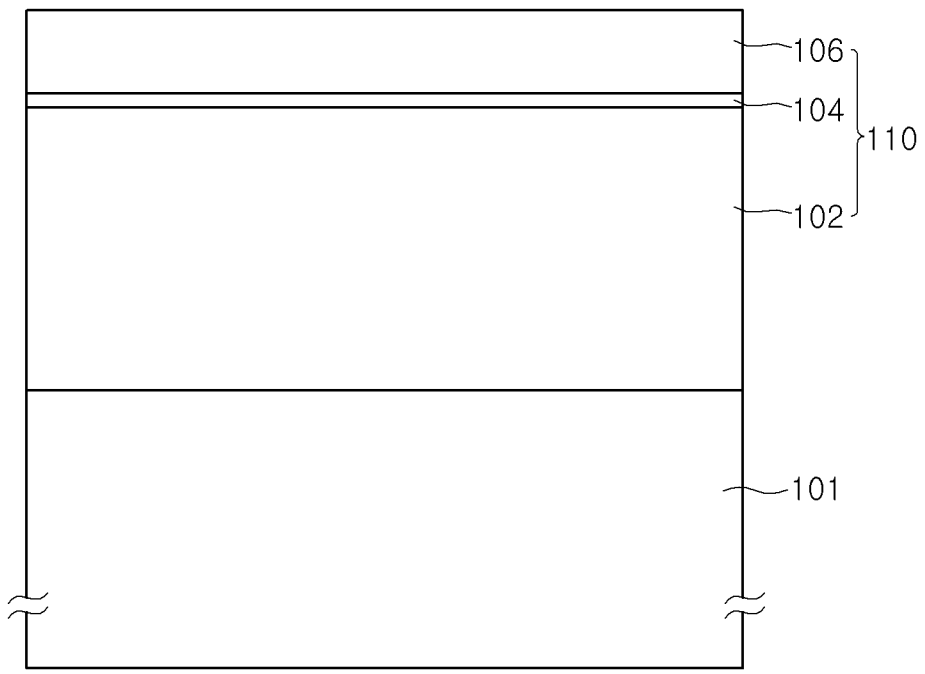
FIGS. 4 to 7 are cross-sectional views illustrating a method for manufacturing a light emitting device according to an embodiment.

First, as shown in FIG. 4, a first substrate 101 is prepared. The first substrate 101 may include a conductive substrate or an insulating substrate. For example, the first substrate 101 may be at least one of sapphire ($Al_2O_3$), SiC, Si, GaAs, GaN, ZnO, Si, GaP, InP, Ge and $Ga_2O_3$ substrates. While an irregular structure may be formed at an upper surface of the first substrate 101, the present disclosure is not limited thereto. A wet etching may be performed with respect to the first substrate 101 to remove an impurity of a surface of the first substrate 101.

Thereafter, a light emitting structure 110 including a first conductive type semiconductor layer 102, an active layer 104 and a second conductive type semiconductor layer 106 is formed on the first substrate 101.

The light emitting structure 110 may be formed by using, for example, a metal organic chemical vapor deposition (MOCVD), a chemical vapor deposition (CVD), a plasma-enhanced chemical vapor deposition (PECVD), a molecular beam epitaxy (MBE), a hydride vapor phase epitaxy (HVPE), or the like, but the present disclosure is not limited thereto.

A buffer layer (not shown) may be formed over the first substrate 101. The buffer layer may buffer a lattice mismatch between the materials constituting the light emitting structure 110 and the first substrate 101, and the buffer layer may be formed of a III-V compound semiconductor, for example, at least one of GaN, InN, AN, InGaN, AlGaN, InAlGaN, and AlInN. An undoped semiconductor layer may be formed over the buffer layer, but the present disclosure is not limited thereto.

The first conductive type semiconductor layer 102 may be formed of III-V compound semiconductor doped with a first conductive type dopant. In the case where the first conductive type semiconductor layer 102 is an N-type semiconductor layer, the first conductive type dopant is an N-type dopant and may include Si, Ge, Sn, Se, and/or Te as the N-type dopant, but the present disclosure is not limited thereto.

The first conductive type semiconductor layer 102 may include a semiconductor material having a compositional formula of $In_xAl_yGa_{1-x-y}N$ ($0 \le x \le 1$, $0 \le y \le 1$, $0 \le x+y \le 1$).

The first conductive type semiconductor layer 102 may be formed of at least one of GaN, InN, AN, InGaN, AlGaN, InAlGaN, AlInN, AlGaAs, InGaAs, AlInGaAs, GaP, AlGaP, InGaP, AlInGaP, and InP.

The first conductive type semiconductor layer 102 may be an N-type GaN layer, which is formed by using a CVD, an MBE, a sputtering, an HVPE, or the like. Also, the first conductive type semiconductor layer 102 may be formed by injecting trimethyl gallium (TMGa) gas, ammonia (NH3) gas, nitrogen (N2) gas, and silane ($SiH_4$) gas including an n-type impurity such as silicon (Si).

Thereafter, an active layer 104 is formed on the first conductive type semiconductor layer 102.

The active layer 104 is a layer emitting light having an energy, which is determined by an inherent energy band of a material constituting the active layer (i.e., light emitting layer) when an electron injected through the first conductive type semiconductor layer 102 meets with and is recombined with a hole injected through the second conductive type semiconductor layer 106.

The active layer 104 may be formed in at least one of a single quantum well structure, a multi quantum well (MQW) structure, a quantum-wire structure, and a quantum dot structure. For example, the active layer 104 may be formed in the MQW structure by injecting trimethyl gallium (TMGa) gas, ammonia ($NH_3$) gas, nitrogen ($N_2$) gas, and trimethyl indium (TMIn) gas, but the present disclosure is not limited thereto.

Well layer/barrier layer of the active layer 104 may be formed in at least one pair structure of InGaN/GaN, InGaN/InGaN, AlGaN/GaN, InAlGaN/GaN, GaAs/AlGaAs(InGaAs), GaP/AlGaP(InGaP), but the present disclosure is not limited thereto. The well layer may be formed of a material having a band gap lower than a band gap of the barrier layer.

A conductive clad layer may be formed over or/and below the active layer 104. The conductive clad layer may be formed of an AlGaN-based semiconductor, and may have a band gap higher than the active layer 104.

Thereafter, a second conductive type semiconductor layer 106 is formed on the active layer 104. The second conductive type semiconductor layer 106 may include III-V compound semiconductor, for example, semiconductor material having a compositional formula of $In_xAl_yGa_{1-x-y}N$ ($0 \le x \le 1$, $0 \le y \le 1$, $0 \le x+y \le 1$). The second conductive type semiconductor layer 106 may be formed of at least one of GaN, InN, AN, InGaN, AlGaN, InAlGaN, AlInN, AlGaAs, InGaAs, AlInGaAs, GaP, AlGaP, InGaP, AlInGaP, and InP. In the case where the second conductive type semiconductor layer 106 is a P-type semiconductor layer, the second conductive type dopant may include Mg, Zn, Ca, Sr, Ba, or the like as a P-type dopant. The second conductive type semiconductor layer 106 may be formed in a single- or multi-layer structure, but the present disclosure is not limited thereto. The second conductive type semiconductor layer 106 may be a P-type GaN layer formed by injecting trimethyl gallium (TMGa) gas, ammonia ($NH_3$) gas, nitrogen ($N_2$) gas, and biscetyl cyclo pentadienyl magnesium (($EtCp_2Mg$){$Mg(C_2H_5C_5H_4)_2$}) including a P-type impurity such as Mg into a chamber, but the present disclosure is not limited thereto.

In the embodiment, the first conductive type semiconductor layer 102 may be implemented by an N-type semiconductor layer and the second conductive type semiconductor layer 106 may be implemented by a P-type semiconductor layer, but the present disclosure is not limited thereto. Alternatively, a semiconductor layer having an opposite conductive type to the second conductive type, for example, an N-type semiconductor layer (not shown) may be formed over the second semiconductor layer 106. Accordingly, the light emitting structure 110 may be implemented in at least one of an N-P junction structure, a P-N junction structure, an N-P-N junction structure, and a P-N-P junction structure.

Figure 5:
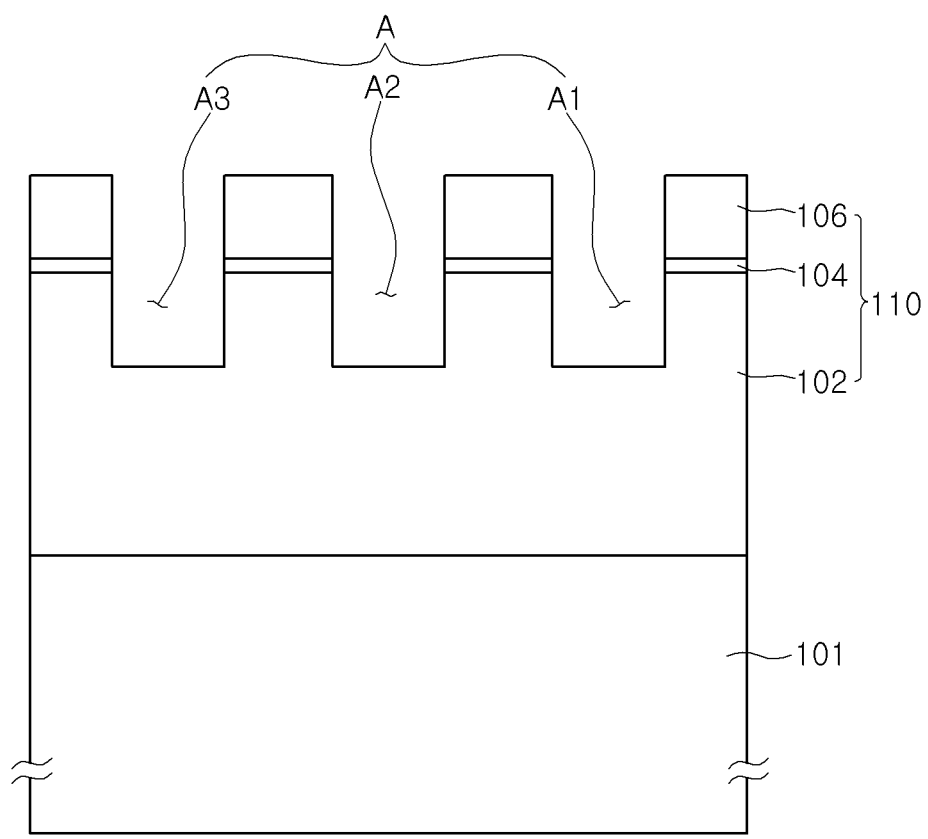

Next, as shown in FIG. 5, the second conductive type semiconductor layer 106, the active layer 104 and the first conductive type semiconductor layer 102 are partially removed to form a plurality of cavities A. The cavity A may be referred to as a recess, groove, ditch, trench, and the like. For example, the cavity A may include a first cavity A1, a second cavity A2, and a third cavity A3, but the present disclosure is not limited thereto. For example, the cavity A may be formed in two or more cavities.

For example, to form the cavity A, an etching may be performed starting from the second conductive type semiconductor layer 106 of a portion positioned vertically below a first electrode 140 to be formed later until the first conductive type semiconductor layer 102 is exposed. The etching for forming the cavity A may be performed by a dry or wet etching.

According to the embodiment, since current is not smoothly supplied to the cavity forming region, light emitting is not generated over the cavity A and thus absorption of light by the first electrode 140 positioned over the cavity A can be minimized. Also, in the embodiment, since the active layer 104 does not exist at the second cavity region A2 positioned vertically below the first electrode 140, generation of light due to the recombination of carriers (electron and hole) does not occur.

Figure 6:
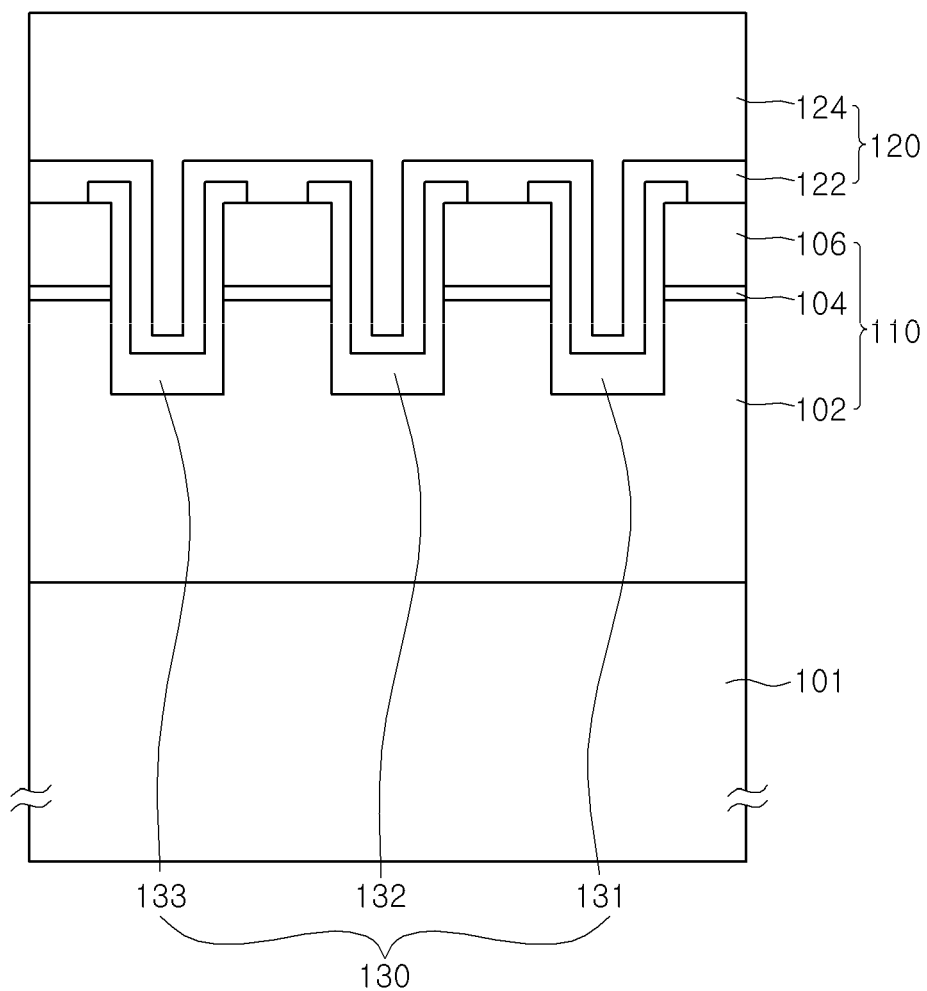

Next, as shown in FIG. 6, a dielectric layer 130 is formed on the cavity A. For example, the dielectric layer 130 may be formed on the cavity A by using oxide or nitride, such as $SiO_2$, $TiO_2$, $Al_2O_3$, SiN, or the like. The dielectric layer 130 may include a first dielectric layer 131, a second dielectric layer 132, and a third dielectric layer 133, but the present disclosure is not limited thereto.

In the embodiment, since the dielectric layer 130 is partially formed on the second conductive type semiconductor layer 106 as well as on a side surface and a bottom surface of the cavity A, the dielectric layer 130 may be maintained rigidly.

Thereafter, a second electrode layer 120 is formed on the second conductive type semiconductor layer 106 and the dielectric layer 130.

The second electrode layer 120 may include an ohmic layer (not shown), a reflective layer 122, a junction layer (not shown), a conductive supporting substrate 124, etc.

For example, the second electrode layer 120 may include an ohmic layer, and the ohmic layer (not shown) may ohmic-contact the light emitting structure 110 to smoothly supply power to the light emitting structure, and may be formed by multi-stacking a single metal layer, a metal alloy layer, and/or a metal oxide layer.

For example, the ohmic layer may be formed including at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the present disclosure is not limited thereto.

Also, the second electrode layer 120 including the reflective layer 122 may reflect light incident from the light emitting structure 110 to improve light extraction efficiency.

For example, the reflective layer 122 may be formed of metal or alloy including at least one of Ag, Ni, Al, Rh, Pd, Ir, Ru, Mg, Zn, Pt, Au, and Hf. Also, the reflective layer 122 may be formed in a multi-layer structure using the foregoing metal or alloy, and a transparent conductive material such as IZO, IZTO, IAZO, IGZO, IGTO, AZO, ATO, etc., for example, a multi-layer structure of IZO/Ni, AZO/Ag, IZO/Ag/Ni, AZO/Ag/Ni, or the like.

Also, in the case where the second electrode layer 120 includes the junction layer (not shown), the reflective layer 122 may function as the junction layer, or may include a barrier metal or bonding metal. For example, the junction layer may include at least one of Ti, Au, Sn, Ni, Cr, Ga, In, Bi, Cu, Ag, and Ta.

Also, the second electrode layer 120 may include the conductive supporting substrate 124. The conductive supporting substrate 124 supports the light emitting structure 110, and may supply power to the light emitting structure 110. The conductive supporting substrate 124 may be comprised of a metal, a metal alloy or a conductive semiconductor material that has superior electrical conductivity.

For example, the conductive supporting substrate 124 may include at least one of copper (Cu), Cu alloy, gold (Au), nickel (Ni), molybdenum (Mo), Cu—W, a carrier wafer (e.g., Si, Ge, GaAs, GaN, ZnO, SiGe, SiC, etc.).

The thickness of the conductive supporting substrate 124 may vary with a design of the LED 100, but may be in a range of 30 μm to 500 μm.

The conductive supporting substrate 124 may be formed by an electrochemical metal deposition method, a plating method, or a bonding method using a eutectic metal.

Figure 7:
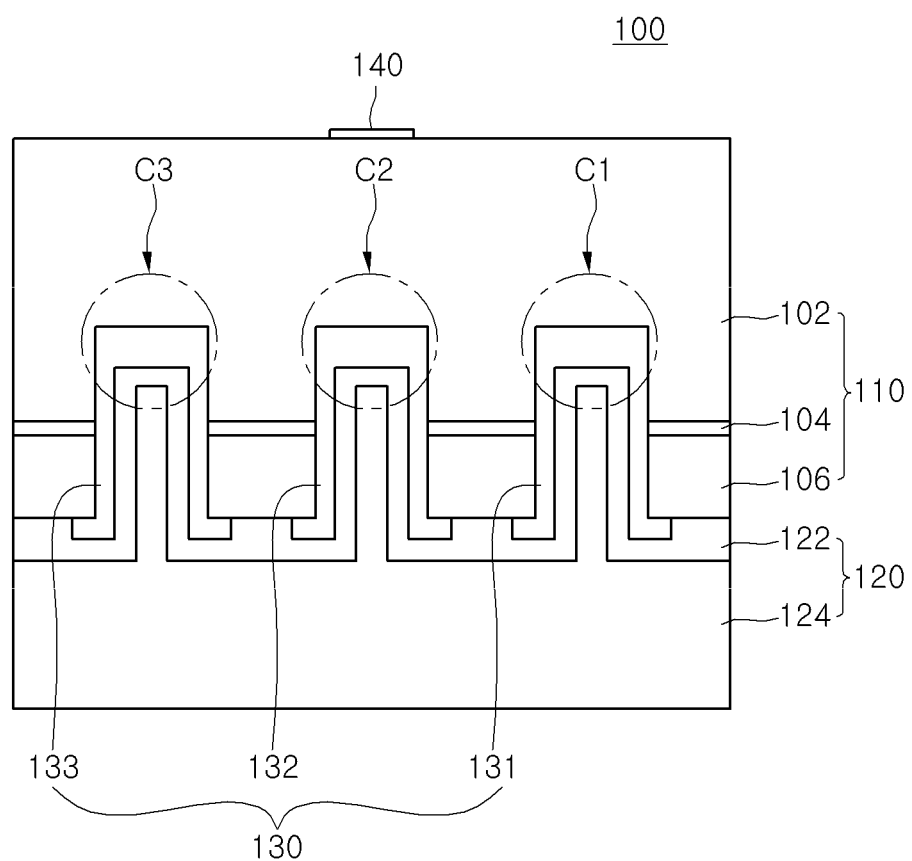

Next, as shown in FIG. 7, the first substrate 101 is removed such that the first conductive type semiconductor layer 102 is exposed. The first substrate 101 may be used by using a laser lift off method, or a chemical lift off method. Also, the first substrate 101 may be removed by physically grinding the first substrate 101.

Thereafter, a first electrode 140 may be formed on the first conductive type semiconductor layer 102 exposed by the removing of the first substrate 101.

The first electrode 140 may include a pad part where a wire bonding is performed, and a finger part extending from the pad part. The finger part may be branched with a pattern shape, and may be formed with various shapes.

A roughness pattern (not shown) for enhancing light extraction efficiency may be on the first conductive type semiconductor layer 102. Also, the roughness pattern may be formed on the first electrode 140, but the preset disclosure is not limited thereto.

The first electrode 140 may be formed on the first conductive type semiconductor layer 102 so as to spatially overlap the cavity A.

In the embodiment, since the second cavity A2 region positioned vertically below the first electrode 140 does not have the active layer 104, generation of light due to recombination of carriers (i.e., electron and hole) does not occur.

In the embodiment, since the cavity A that is an etched region is covered with the dielectric layer 130, current does not flow but flows through regions other than the cavity A. That is, since the cavity is covered with the dielectric layer, the cavity functions as a current blocking layer (CBL). By the above constitution, efficient current flow is generated, so that the reliability can be enhanced and absorption of light by the first electrode can be minimized, thereby increasing light quantity.

In the embodiment, capacitance may be expressed by the following equation:

$$C = \in \times A/d,$$

where $\in$ is permittivity of dielectric layer, A is area of dielectric layer, and d is thickness of dielectric layer.

As seen from the above equation, the larger the permittivity and the area are and the smaller the thickness is, the higher the capacitance C is. Therefore, structure and property of the dielectric layer play an important role in preventing an impact of the active layer in the ESD.

A passivation layer (not shown) may be formed on at least a side surface of the light emitting structure 110. The passivation layer may be formed on the first conductive type semiconductor layer 102, but the present disclosure is not limited thereto.

The passivation layer may be formed of, for example, SiOx, SiOxNy, Si3N4, or Al2O3 so as to electrically protect the light emitting structure 110, but the present disclosure is not limited thereto.

Thereafter, the light emitting structure 110 is subject to an isolation etching according to a unit chip region thereof and thus the light emitting structure 110 may be separated into a plurality of light emitting structures 110. For example, the isolation etching may be performed by a dry etching method such as inductively coupled plasma (ICP).

The light emitting structure 110 may be separated into the unit chip regions through a chip separation process, thereby manufacturing a plurality of light emitting devices.

The chip separation process may include a breaking process which separates the light emitting structure into unit chips by applying a physical force, a laser scribing process which separates the light emitting structure into unit chips by irradiating laser beam onto a boundary between chips, and an etching process including a wet etching and a dry etching, but the present disclosure is not limited thereto.

Figure 8:
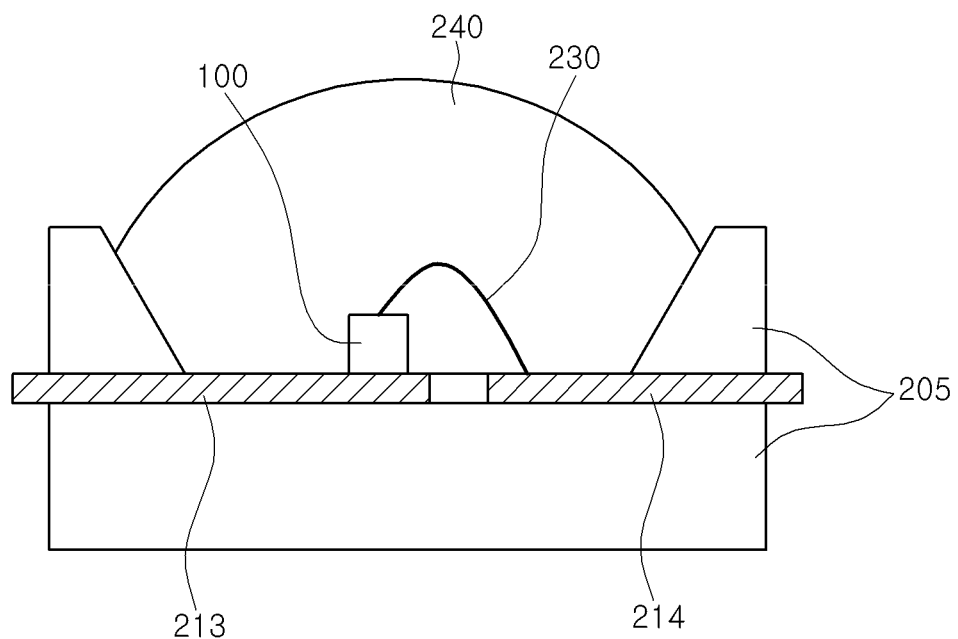
FIG. 8 is a cross-sectional view of a light emitting device package provided with a light emitting device according to an embodiment.

FIG. 8 is a cross-sectional view of a light emitting device package 200 provided with a light emitting device according to an embodiment.

Referring to FIG. 8, the light emitting device package 200 according to the embodiment includes a package body 205, third and fourth electrode layers 213 and 214 mounted over the package body 205, an LED 100 mounted over the package body 205 and electrically connected to the third and fourth electrode layers 213 and 214, and a molding member 240 enclosing the LED 100.

The package body 205 may be formed including a silicon material, a synthetic resin material, or a metal material, and may have an inclination surface around the LED 100.

The third electrode layer 213 and the fourth electrode layer 214 are electrically separated, and function to supply power to the LED 100. Also, the third and fourth electrode layers 213 and 214 may reflect light generated from the LED 100 to thus increase light efficiency, and may emit heat generated from the LED 100.

The LED 100 may be a vertical type LED shown in FIG. 1, but the present disclosure is not limited thereof. For example, a horizontal type LED may be applied to the light emitting device package 200.

The LED 100 may be mounted over the package body or over the third electrode layer 213 or the fourth electrode layer 214.

The LED 100 may be electrically connected to the third electrode layer 213 and/or the fourth electrode layer 214 by using any one of a wire bonding method, a flip chip method, and a die bonding method. The current embodiment exemplarily shows that the LED 100 is electrically connected to the third electrode layer 213 through a wire 230 and is electrically connected to the fourth electrode layer 214 through a direct contact with the fourth electrode layer 214.

The molding member 240 may enclose and protect the LED 100. Also, a fluorescent material may be included in the molding member 240 to change the wavelength of light emitted from the LED 100.

The light emitting device package according to the embodiment may include a plurality of optical members, such as a light guide panel, a prism sheet, a diffusion sheet, a fluorescent sheet, and the like, which are arranged on a path of light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

Figure 9:
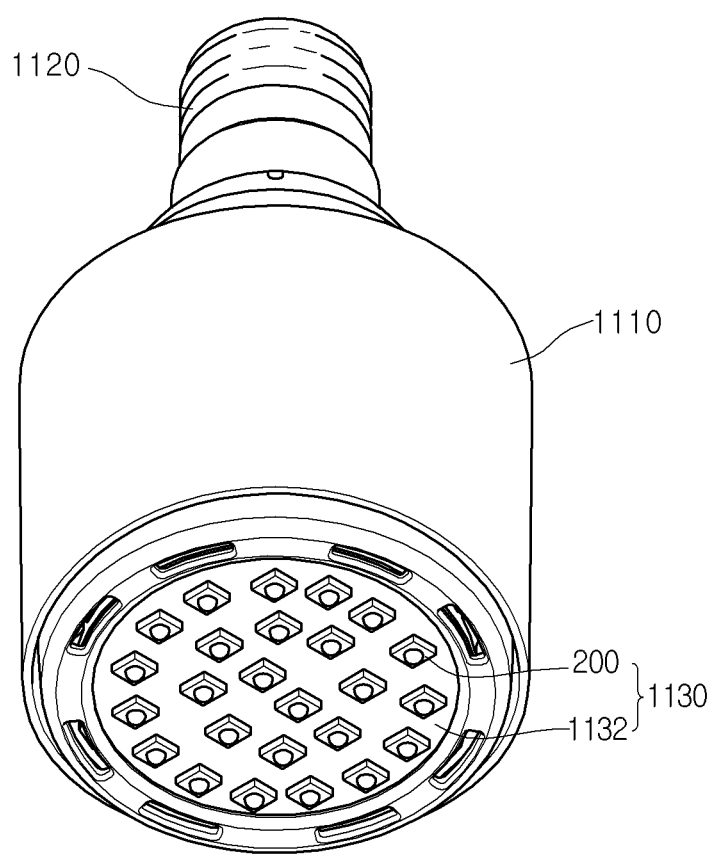
FIG. 9 is a perspective view of a lighting unit according to an embodiment.

FIG. 9 is a perspective view of a lighting unit 1100 according to an embodiment. The lighting unit 110 shown in FIG. 9 is an example of lighting systems, and the present disclosure is not limited thereto.

Referring to FIG. 9, the lighting unit 1100 may include a case body 1110, a light emitting module part 1130 equipped in the case body 1110, and a connection terminal 1120 equipped in the case body 1110 and supplied with an electric power from an external power supply.

The case body 110 may be preferably formed of a material having good heat shielding characteristics, for example, a metal material or a resin material.

The light emitting module part 1130 may include a substrate 1132, and at least one light emitting device package 200 mounted on the substrate 1132.

The substrate 1132 may be an insulator substrate on which a circuit pattern is printed, and may include, for example, a general printed circuit board (PCB), a metal core PCB, a flexible PCB, a ceramic PCB, etc.

Also, the substrate 1132 may be formed of a material to efficiently reflect light, and a surface thereof may be formed in a color capable of efficiently reflecting light, for example, white color, or silver color.

The at least one light emitting device packages 200 may be mounted on the substrate 1132. Each of the light emitting device packages 200 may include at least one light emitting diode (LED) 100. The light emitting diode 100 may include a color LED emitting red, green, blue or white light, and a UV LED emitting ultraviolet (UV).

The light emitting module part 1130 may have a combination of several LEDs so as to obtain desired color and luminance. For example, the light emitting module part 1130 may have a combination of a white LED, a red LED, and a green LED so as to obtain a high color rendering index (CRI).

The connection terminal 1120 may be electrically connected to the light emitting module part 1130 to supply power. As shown in FIG. 9, the connection terminal 1120 may be screwed and coupled to an external power in a socket type, but the present disclosure is not limited thereto. For example, the connection terminal 1120 may be made in a pin type and inserted into an external power, or may be connected to the external power through a power line.

Figure 10:
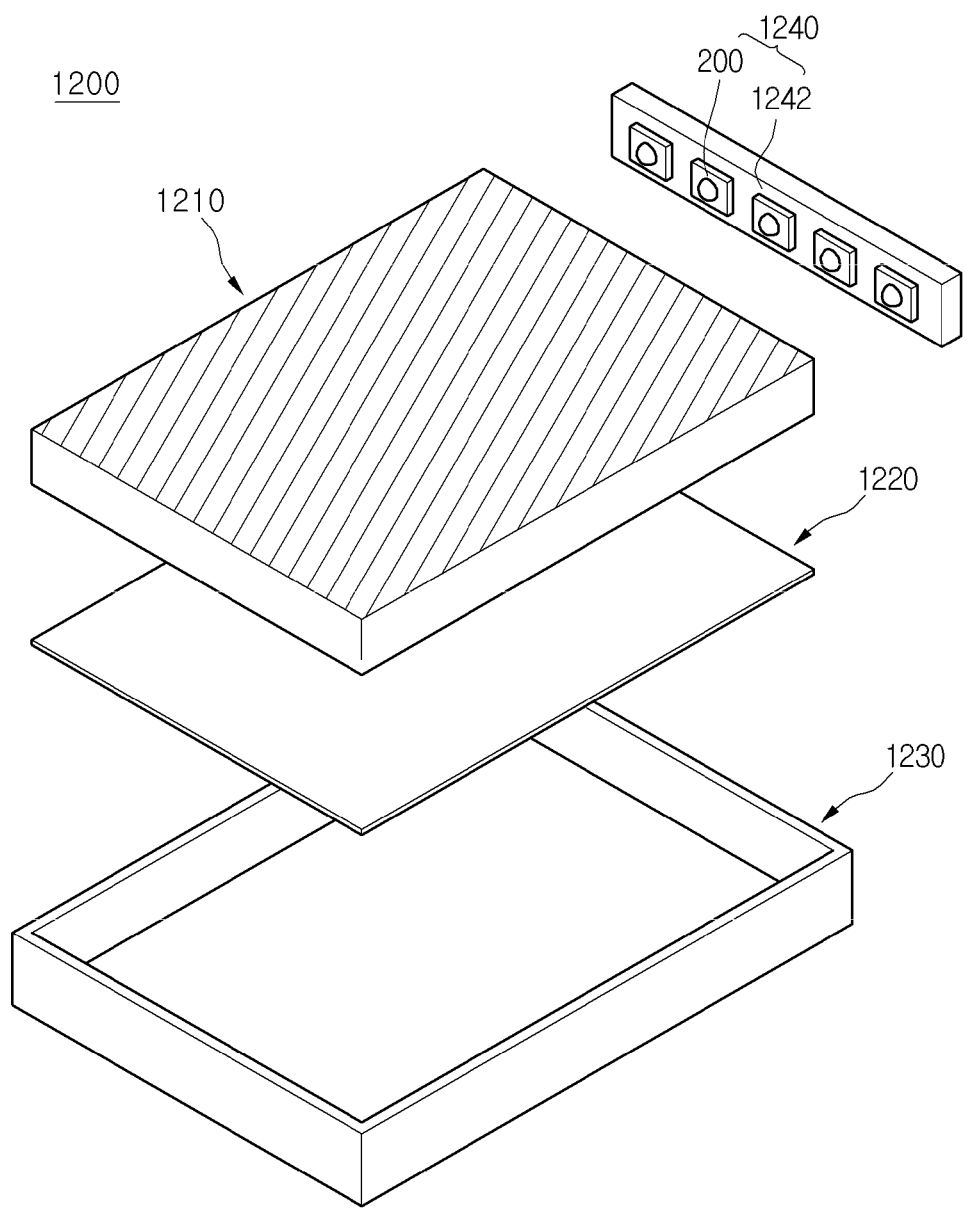
FIG. 10 is a disassembled perspective view of a backlight unit according to an embodiment.

FIG. 10 is a disassembled perspective view of a backlight unit 1200 according to an embodiment. The backlight unit 1200 shown in FIG. 10 is an example of lighting systems, and the present disclosure is not limited thereto.

The backlight unit 1200 according to the embodiment may include a light guide panel 1210, a light emitting module part 1240 supplying light to the light guide panel 1210, a reflective member 1220 below the light guide panel 1210, and a bottom cover 1230 receiving the light guide panel 1210, the light emitting module part 1240, and the reflective member 1220, but the present disclosure is not limited thereto.

The light guide panel 1210 functions to transform linear light to planar light by diffusing the linear light. The light guide panel may include one of acryl-series resin such as polymethyl metaacrylate (PMMA), polyethylene terephthlate (PET), poly carbonate (PC), COC, and polyethylene naphthalate resin.

The light emitting module part 1240 provides light to at least a side surface of the light guide panel 1210, and finally acts as a light source of a display device in which the backlight unit is equipped.

The light emitting module part 1240 may contact the light guide panel 1210, but the present disclosure is not limited thereto. The light emitting module part 1240 includes a substrate 1242, and a plurality of light emitting device packages 200 mounted on the substrate 1242. The substrate 1242 may contact the light guide panel 1210, but the present disclosure is not limited thereto.

The substrate 1242 may be a PCB including a circuit pattern (not shown). The substrate 1242 may include a metal core PCB (MCPCB), a flexible PCB (FPCB), etc. as well as the general PCB, but the present disclosure is not limited thereto.

The plurality of light emitting device packages 200 may be mounted over the substrate 1242 such that light emitting surfaces of the plurality of light emitting device packages 200 are spaced apart by a predetermined distance from the light guide panel 1210.

The reflective member 1220 may be provided below the light guide panel 1210. The reflective member 1220 reflects light incident from a bottom surface of the light guide panel to allow the reflected light to be directed toward an upper direction, thereby capable of enhancing brightness of the backlight unit. The reflective member 1220 may be formed of, for example, PET, PC, PVC resin, or the like, but the present disclosure is not limited thereto.

The bottom cover 1230 may receive the light guide panel 1210, the light emitting module part 1240, the reflective member 1220, and the like. For this purpose, the bottom cover 1230 may be formed in a box shape a top surface of which is opened, but the present disclosure is not limited thereto.

The bottom cover 1230 may be formed of a metal material or resin material, and may be manufactured by using a process such as a press molding or an injection molding.

By the LED, the LED package and the manufacturing method thereof according to the embodiments, electrostatic discharge damage of the LED can be prevented without any loss of light absorption.

That is, the dielectric layer is formed on a local region in an LED chip, and an electrode is formed on the dielectric layer to thus connect a light emitting diode and capacitors in parallel. Through the above constitution, in a forward DC bias, current flows into a light emitting layer that is the active region, to generate light, but in a discharging, since RF energy generated by a pulse type ESD impact flows into dielectric layers of the capacitors layer, the light emitting layer can be protected.

Also, since the capacitors are formed in the LED chip to prevent ESD damage, packaging cost and process can be simplified and decrease in the absorption amount of light can be minimized.

Also, since current flow may be efficiently controlled, light extraction efficiency can be increased. Further, according to the embodiment, current spreading can enhance the reliability of the LED.

Any reference in this specification to 'one embodiment,' 'an embodiment,' 'example embodiment,' etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure including a first conductive type semiconductor layer, an active layer over the first conductive type semiconductor layer, and a second conductive type semiconductor layer over the active layer;
    a plurality of dielectric layers, one each formed in a plurality of cavities, respectively, the plurality of cavities formed in the light emitting structure;
    a first electrode over the first conductive type semiconductor layer; and
    a second electrode layer below the dielectric layers,
    wherein the second electrode comprises a protruding portion extending into the light emitting structure and the protruding portion is in each of the plurality of cavities,
    wherein a substantially central portion of the protruding portion spatially overlaps with a substantially central portion of the first electrode, and
    wherein at least one of the plurality of dielectric layers spatially overlaps with both the substantially central portion of the protruding portion and the substantially central portion of the first electrode,
    wherein the at least one of the plurality of dielectric layers is interdisposed between the substantially central portion of the protruding portion and the substantially central portion of the first electrode.

2. The light emitting device of claim 1, wherein the plurality of cavities are defined by partially and sequentially removing the second conductive type semiconductor layer and the active layer until a portion of the first conductive type semiconductor is exposed.

3. The light emitting device of claim 1, wherein the second electrode layer comprises:
    a reflective layer over the dielectric layer; and
    a conductive substrate over the reflective layer.

4. The light emitting device of claim 1, wherein the first electrode spatially overlaps a portion of one cavity of the plurality of cavities.

5. The light emitting device of claim 1, wherein in a constant voltage, current flows into the active layer to emit light, and in an electrostatic discharging, some of the current flows into the dielectric layer.

6. The light emitting device of claim 1, wherein the substantially central portion of the protruding portion contacts a bottom surface of the at least one of the plurality of dielectric layers.

7. The light emitting device of claim 1, wherein the plurality of dielectric layers comprise:
    a first dielectric layer on an upper surface of the protruding portion; and
    a second dielectric layer on a side surface of the protruding portion,
    wherein the first dielectric layer is interdisposed between the substantially central portion of the protruding portion and the substantially central portion of the first electrode, and
    the first dielectric layer is thicker than the second dielectric layer.

8. The light emitting device of claim 1, wherein the plurality of cavities comprise a rectangular shape cross section.

9. A light emitting device comprising:
a light emitting structure including a first conductive type semiconductor layer, and a second conductive type semiconductor layer over the active layer;
a plurality of capacitors each on a plurality of cavities, respectively, the plurality of cavities formed in the light emitting structure; and
a first electrode layer over the light emitting structure,
wherein the plurality of capacitors each comprise the first conductive type semiconductor layer, a dielectric layer over the respective cavity, and a second electrode layer below the dielectric layer;
wherein the second electrode comprises a protruding portion extending into the light emitting structure and the protruding portion is in each of the plurality of cavities,
wherein a substantially central portion of the protruding portion spatially overlaps with a substantially central portion of the first electrode, and
wherein at least one portion of the dielectric layer spatially overlaps with both the substantially central portion of the protruding portion and the substantially central portion of the first electrode,
wherein the at least one portion of the dielectric layer is interdisposed between the substantially central portion of the protruding portion and the substantially central portion of the first electrode.

10. The light emitting device of claim 9, wherein the second electrode layer comprises:
a reflective layer over the dielectric layer; and
a conductive substrate over the reflective layer.

11. The light emitting device of claim 9, wherein the first electrode spatially overlaps a portion of the plurality of cavities.

12. The light emitting device of claim 1, wherein a lateral width of the first electrode is the same as or less than a lateral width of one of the plurality of cavities.

13. The light emitting device of claim 9, wherein a lateral width of the first electrode is the same as or less than a lateral width of one of the plurality of cavities.

14. The light emitting device of claim 9, wherein the substantially central portion of the protruding portion contacts a bottom surface of the dielectric layer.

15. The light emitting device of claim 9, wherein the dielectric layer comprises:
a first dielectric layer on an upper surface of the protruding portion; and
a second dielectric layer on a side surface of the protruding portion,
wherein the first dielectric layer is interdisposed between the substantially central portion of the protruding portion and the substantially central portion of the first electrode, and
the first dielectric layer is thicker than the second dielectric layer.

16. The light emitting device of claim 9, wherein the plurality of cavities comprise a rectangular shape cross section.

* * * * *